United States Patent [19]

Sharber

[11] 4,315,217
[45] Feb. 9, 1982

[54] BATTERY ANALYZER FOR ELECTRIC GOLF CARTS

[76] Inventor: John M. Sharber, 1408 Doris Dr., Sulpher Springs, Tex. 75482

[21] Appl. No.: 73,682

[22] Filed: Sep. 10, 1979

[51] Int. Cl.³ .......................................... G01N 27/42
[52] U.S. Cl. ................................................... 324/434
[58] Field of Search ...................................... 324/434

[56] References Cited

U.S. PATENT DOCUMENTS

| | | | |
|---|---|---|---|
| 2,225,051 | 12/1940 | Heyer | 324/434 |
| 3,487,295 | 12/1969 | Nocera et al. | 324/434 |
| 3,586,962 | 6/1971 | Rebstock | 324/434 |

*Primary Examiner*—Michael J. Tokar
*Attorney, Agent, or Firm*—Larry B. Dwight

[57] ABSTRACT

A battery tester for testing individual batteries on an electrically driven vehicle such that as the vehicle is in motion, the condition of each battery in a series connected power source maybe analyzed. The device briefly comprises indicator device such as the meter and connection devices to isolate individual battery to determine the voltage of each battery as the vehicle is being driven.

1 Claim, 3 Drawing Figures

BATTERY ANALYZER FOR ELECTRIC GOLF CARTS

BACKGROUND OF THE INVENTION

This invention relates to a battery analyzer for electric vehicles using a plurality of storage batteries connected in series for a power supply and most particularly in electric golf carts.

Heretofore devices for analyzing batteries generally analyze the total voltage of the system and are difficult to use when in the field with the vehicle.

Often an electrically driven vehicle will apppear to be fully charged but the batteries may fail after a short period of use due to a defective battery in the series. This can lead to a difficult situation when say a golf cart fails on the back side of the course where a tow vehicle then must be employed to remove the cart to the club house for repairs. Further, this creates loss of revenues and annoyance for the golfer.

Devices such as that disclosed by U.S. Pat. No. 4,028,616 show a battery analyzer system connected to a single battery by aligator clips which may be used to test a battery such as in an automobile, which is cranking an engine.

Another type of device disclosed in U.S. Pat. No. 4,044,300 discloses an analyzer which tests the individual cells in a storage battery. As U.S. Pat. No. 4,080,560 discloses an analyzer for use on a single battery on a vehicle.

Other references disclosing various types of analyzers include U.S. Pat. Nos. 3,656,061; 3,586,962; 3,321,754 and 3,307,101.

SUMMARY

I have devised a device for analyzing the condition of batteries individually and as a whole when the batteries are in an electric vehicle. The device tests the batteries under static conditions and dynamic conditions.

The device comprises a series of connections between opposite poles of the storage batteries to a multi-pole switch such that each individual battery may be checked. An indicator device such as a meter is then connected in the circuit for determining the charge on the battery in percentage of an ideal voltage or voltage read-out.

A primary object of the invention is to provide a device capable of testing each individual battery in a plurality of series connected batteries in an electric vehicle.

A further object of the invention is to provide a device for testing the batteries while under loading and traveling conditions in the field to isolate individual batteries which are declining in voltages and thus likely to fail.

Other and further objects of the inventions will become apparent upon studying the detail description hereinafter following the drawings attached hereto.

DESCRIPTION OF THE DRAWING

Drawings of a preferred embodiment of the invention are attached hereto so that the invention may be better and more fully understood, in which.

Numeral references are used to designate like parts throughout the various figures of the drawings.

DESCRIPTION OF THE PREFERRED EMBODIMENT

Figure 3:
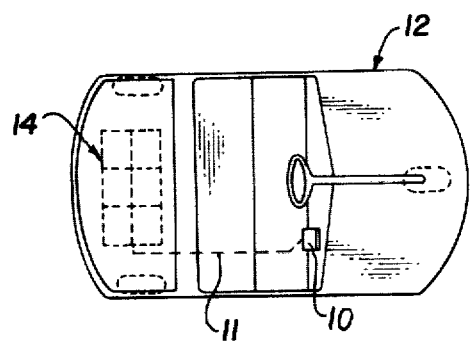
FIG. 3 is a planned view showing the tester in a typical electrical vehicle such as a golf cart.

Referring to FIG. 3, the battery analyzer device generally designated 10 is mounted in an electrically driven vehicle such as electric golf cart 12. The golf cart 12 may be of a three-wheel type as illustrated in the drawing or a four-wheel type. It is fairly common for most electrical type vehicles to use 36 volt D. C. electric system utilizing six 6-volt storage batteries as a power source. However, it should be appreciated that other combinations and voltages can be used. Power source 14 is secured in an arrangement in the rear portion of the golf cart 12. As illustrated in the example, six 6-volt connected in a series circuit to produce a total of 36 volts.

Figure 1:
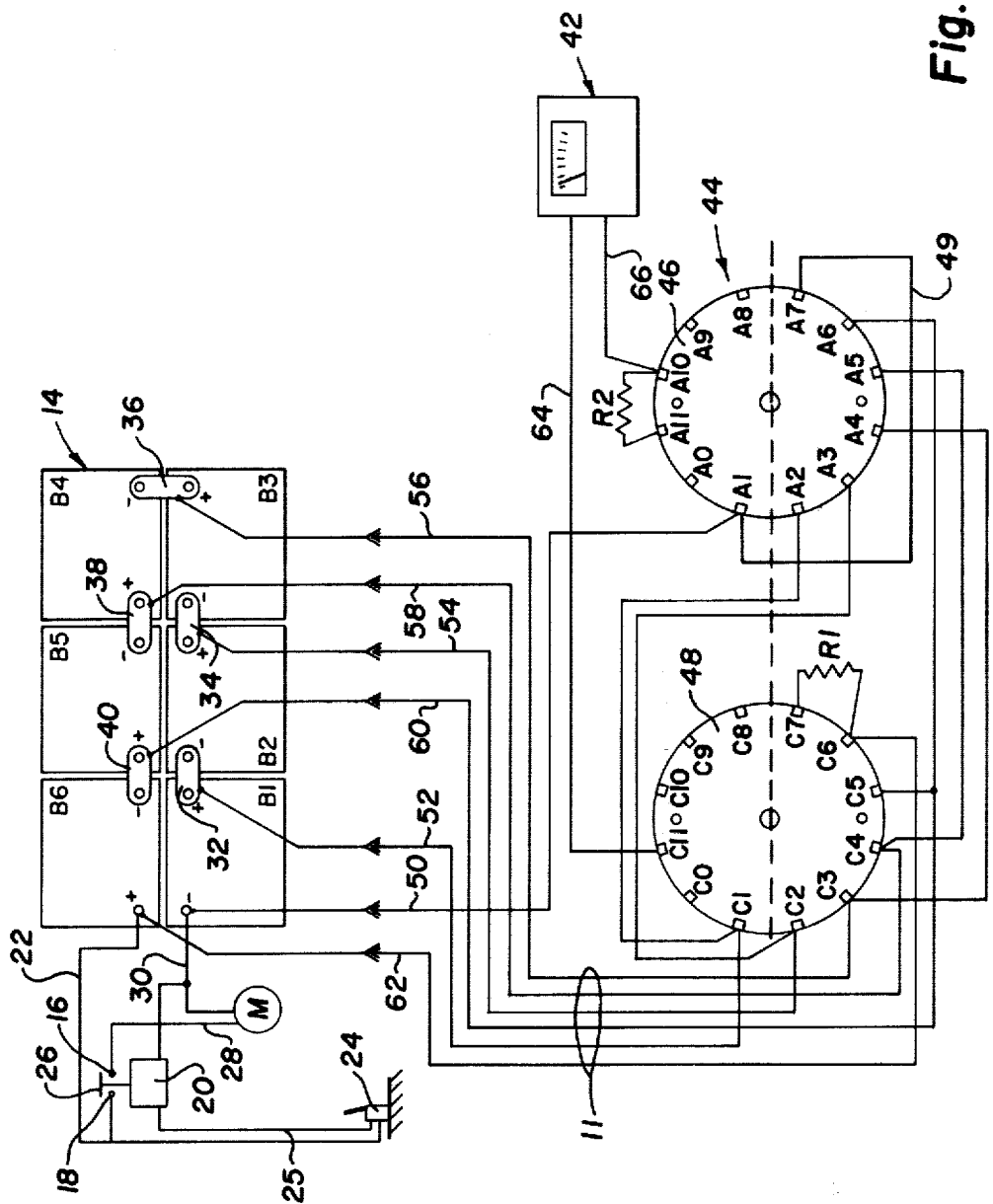
FIG. 1 is a diagrammatic view of the tester connected to the electrical system of the vehicle, the switch being shown in a rear view.

As illustrated in FIG. 1, the positive side of the battery B-6 is connected to contact 16 by line 22. Line 22 also connects to one side of the foot switch 24 and line 25 connects to relay 20. The other side of relay 20 is grounded thus when foot switch 24 is closed the pole 26 completes a circuit across contacts 18 and 16 from line 22 to 28 to motor M. Line 20 connects motor M to the negative pole of battery B-1. Thus, when switch 24 is closed, contacts 16 and 18 are closed to energize motor and drive the vehicle 14. The analyzer device 10 is connected to the batteries 14 by a cable 11.

Generally, the six storage batteries B-1 through B-6 are connected in series by connectors 32, 34, 36, 38 and 40, which generally comprise some conductive material.

The analyzer device 10 generally comprise an indicator means such as a meter 42 having indicia printed on a scale to indicate percentage of a total charge or voltage. Meter 42 may be an ammeter or volt meter.

Selector means 44 comprises a multi-position rotary switch having a first wafer 46 and a second wafer 48. Wafer 46 has a plurality of contacts A-0 thru A-11 and wafer 48 has plurality of contacts C-0 thru C-11. A first connector line 50 is connected between the negative pole of the battery B-1 and contact A-1. Line 49 connects contact A-1 to opposite contact A-7. Line 52 connects with connector 32 between the positive side of battery B-1 and the negative side of battery B-2 with contacts C-1 and A-2. Line 54 joins connector 34 between the positive connection of battery B-2 and the negative terminal of battery B-3 with contacts C-2 and A-3. Line 56 joins connector 36 between the positive terminal of battery B-3 and negative terminal of battery B-4 with contacts C-3 and A-4. Line 58 joins the connector 36 between positive terminal of battery B-4 and the negative terminal of battery B-5 with contacts C-4 and A-5. Line 60 joins the connector 40 between the positive terminal of battery B-5 and the negative terminal of battery B-6 with contacts C-6 and A-6. The positive terminal of battery B-6 is joined with contacts C-6 and A-7 of selector means 44.

Figure 2:
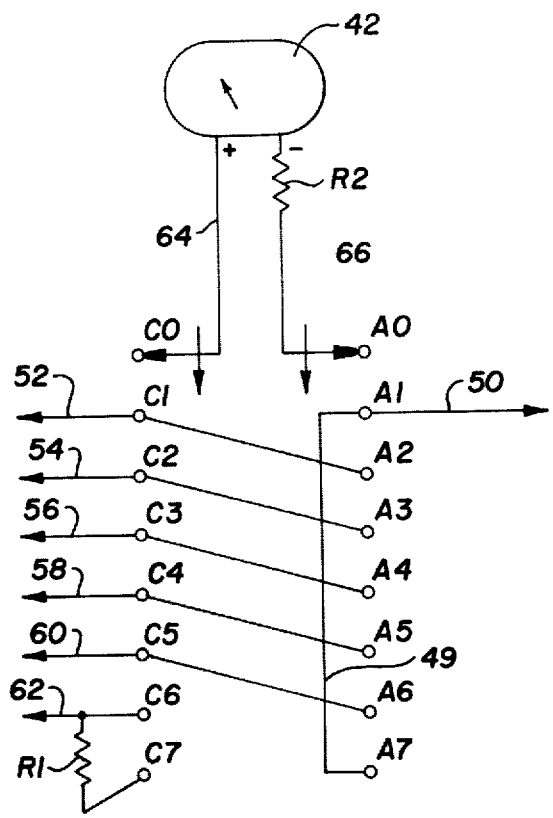
FIG. 2 is a simplified schematic view of the tester.

A shunt resistor R-1 is connected between contact C-6 and C-7 of selector means 44 to divide the total voltage in this example 36 volts to provide a reading on meter 42 within the same scale as used for each individual battery. The negative terminal of meter 42 is connected by line 66 to contacts A-10 and A-11. The positive terminal of meter 42 is connected by line 64 to contact C-11. Contact A-11 is always in contact with the wiper of the switch. Resistor R-2 divides the battery voltage (6 volts) to allow a reading on the scale of meter 42 as better illustrated in FIG. 2. Contacts C-0 and A-0 represent the off position. As the wiper on the rotary switch moves counter clockwise as illustrated in FIG. 3, contact is made between contacts C-1 and A-1, thus connecting the meter 42 between the poles of battery B-1. A connection is made between contacts C-2 and A-2 to read the voltage across the poles of battery B-2 and so forth throughout the range of the switch. The last contacts C-7 and A-7 provides a reading of the total voltage of the batteries used in the system. It should be readily apparent that other connections may be made at the relay contacts 18 and 16 and across the motor M to test the voltage at these points to assure proper operation of the contacts and the motor.

Typical values of components used in an example would be a ten milliammeter, R-1 having a value of 3600 ohms, and R-2 having a value of 600 ohms when used in conjunction with a 6 volt system providing a maximum of 36 volts total. Of course the resistors will be varied upon changing of the ammeter.

Operation of the hereinbefore described device is as follows:

The selector means 44 is moved through each of the 6 individual batteries position. A fully charged battery should read approximately full scale on the indicator means 42 a battery less that 95% would be suspect and requires dynamic testing. With a battery charger connected to the battery, and in the charge cycle, a good battery would indicate more than a 100%.

To proceed with dynamic testing, move the switch indicator 44 to position 1 to test the first battery and start the golf cart. The voltage may drop a small amount and should quickly return to normal voltage. All batteries should be checked by moving the switch 44 through each position as the cart is moving. The key to the battery condition is the amount of drop and return to normal voltage. Guidelines that can be used are shown in the following chart:

|      | Nominal | Drop Dynamic |
|------|---------|--------------|
| Good | 100%    | 95%          |
| Fair | 100%    | 85%          |
| Poor | 100%    | 65%          |
| Bad  | 100%    | 50% or less  |

A meter reading of less than zero indicates a battery of reversed plurality.

By moving the switch 44 to the last or seventh position while the cart is moving total voltage i.e. 36 volts may be measured. Batteries should be checked during and after periodical times during their use for example: A golf cart may be checked during and after the first nine holes and there after each hole of golf. As the batteries are used, any battery which is defective will become more and more evident as the heavy loads of up hill travel will place a burden upon these batteries. Often times the cart will run for a period of time with a defective battery however, sooner or later these batteries will need to be replaced, which show that they are not capable of maintaining a full charge.

Having described my invention, I claim:

1. A battery tester in a vehicle comprising: an electrically driven vehicle; a plurality of wet cell batteries mounted in said vehicle to provide a power source; an electric motor drivingly connected to said vehicle; switch means to connect the batteries to said motor; an electric meter secured to said vehicle for measuring voltage; a multi-pole rotary switch having resistors for forming a voltage divider; connector lines connecting said rotary switch to said meter; electric connectors secured between each pole of said batteries and at least one pole of said switch such that voltage of said individual battery can be measured; electric connector means secured between each side of said switch means and said rotary switch to measure the voltage drop across the switch; and electric connectors secured between each side of said electric motor and to a pole of said rotary switch to measure voltage drop across said motor.

* * * * *